United States Patent
Cafaro et al.

(10) Patent No.: US 7,620,133 B2
(45) Date of Patent: Nov. 17, 2009

(54) METHOD AND APPARATUS FOR A DIGITAL-TO-PHASE CONVERTER

(75) Inventors: Nicholas G. Cafaro, Coconut Creek, FL (US); Thomas L. Gradishar, Boynton Beach, FL (US); Robert E. Stengel, Pompano Beach, FL (US)

(73) Assignee: Motorola, Inc., Schaumburg, IL (US)

( * ) Notice: Subject to any disclaimer, the term of this patent is extended or adjusted under 35 U.S.C. 154(b) by 697 days.

(21) Appl. No.: 10/983,447

(22) Filed: Nov. 8, 2004

(65) Prior Publication Data

US 2006/0098771 A1 May 11, 2006

(51) Int. Cl.
*H04L 7/00* (2006.01)
(52) U.S. Cl. .................... 375/354; 375/371; 327/141; 327/144; 327/161; 327/269; 327/271
(58) Field of Classification Search .............. 375/354, 375/371, 373, 375, 376, 355; 327/100, 141, 327/144, 147, 152, 153, 161, 269, 271; 370/516, 370/517, 518, 519; 455/165.1, 260; 377/76, 377/78
See application file for complete search history.

(56) References Cited

U.S. PATENT DOCUMENTS

| | | | |
|---|---|---|---|
| 4,290,022 A | 9/1981 | Pluckette | |
| 4,637,018 A | 1/1987 | Flora | |
| 4,933,890 A * | 6/1990 | Nuytkens et al. | 708/276 |
| 5,036,528 A * | 7/1991 | Costantino et al. | 375/119 |
| 5,539,344 A * | 7/1996 | Hatakenaka | 327/147 |
| 5,712,582 A * | 1/1998 | Yokota et al. | 327/156 |
| 5,977,805 A | 11/1999 | Vergnes | |
| 6,510,191 B2 | 1/2003 | Bockelman | |
| 6,642,800 B2 | 11/2003 | Drapkin | |
| 2004/0046597 A1* | 3/2004 | Alon et al. | 327/278 |
| 2004/0174192 A1* | 9/2004 | Cafaro et al. | 327/105 |

* cited by examiner

*Primary Examiner*—Mohammad H Ghayour
*Assistant Examiner*—Leila Malek
(74) *Attorney, Agent, or Firm*—Valerie M. Davis

(57) ABSTRACT

A DPC (300) includes: a frequency source (310) for generating a clock signal; a delay line (320) for receiving the clock signal and generating phase-shifted clock signals at output taps; a digital control device (330) for generating a control signal; and a windowing and selection circuit for generating the output signal, that includes sequential logic devices (500, 510, 520) and a combining network. A method for use in a DPC includes: receiving (400) a control signal based on a desired output signal that identifies a first output tap on the delay line; based on the control signal, selecting (410) at least two output taps on the delay line for receiving at least two different phase-shifted clock signals; and generating (420) an output signal based on the control signal and the received phase-shifted clock signals that is substantially the desired output signal.

17 Claims, 6 Drawing Sheets

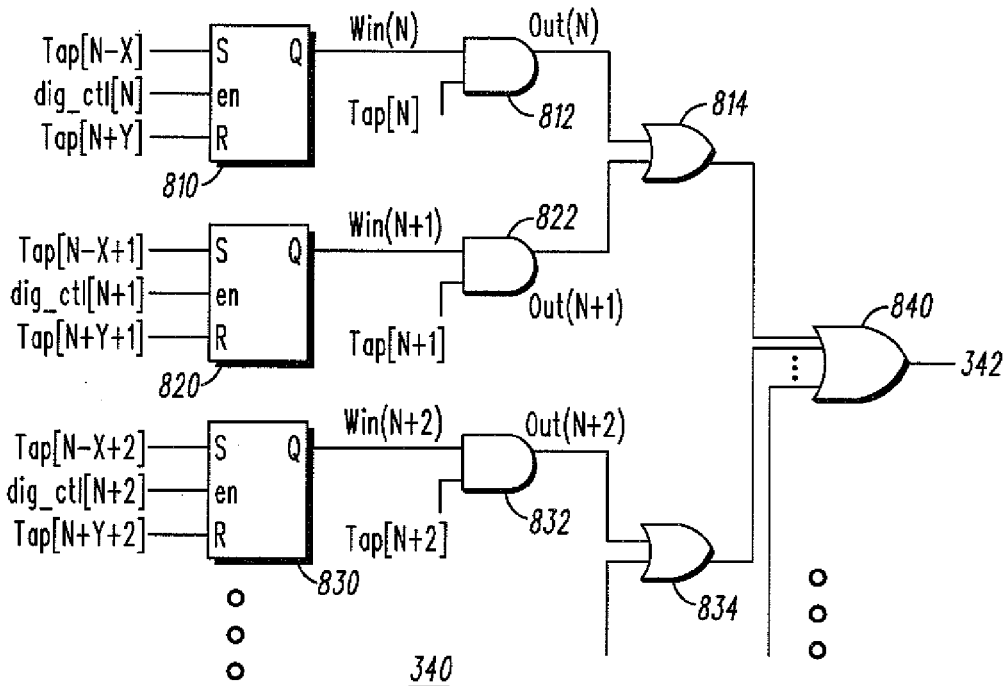
FIG. 8
FIG. 9
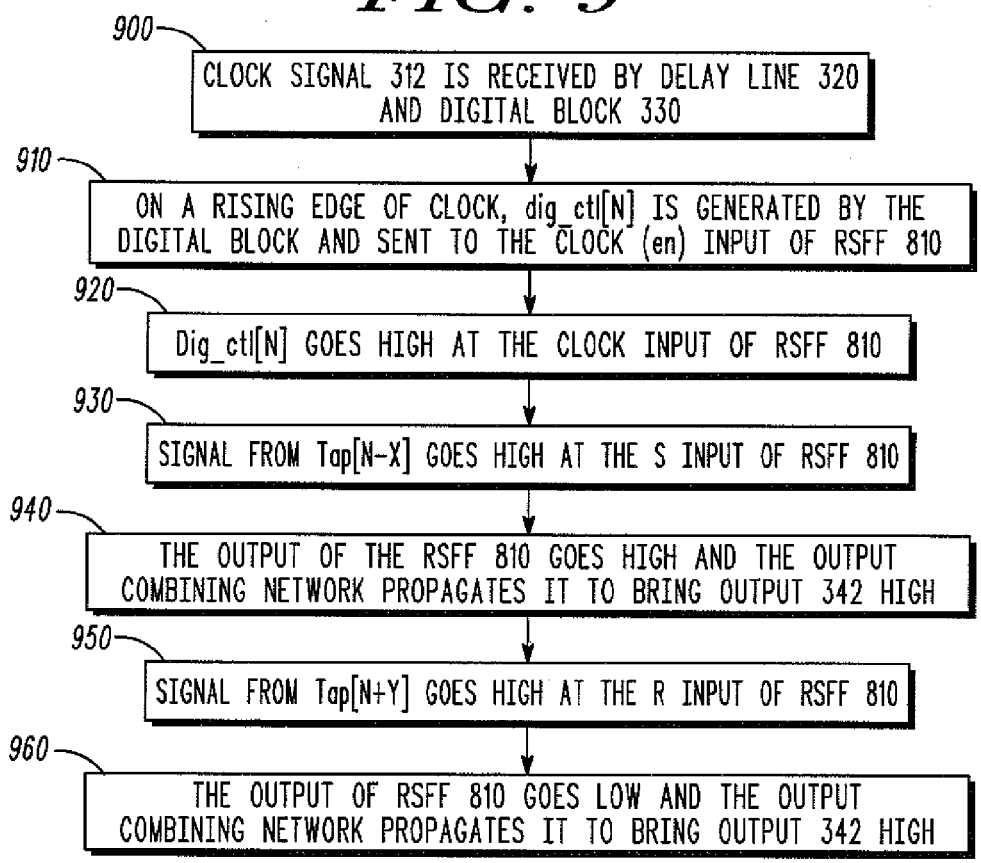

METHOD AND APPARATUS FOR A DIGITAL-TO-PHASE CONVERTER

FIELD OF THE INVENTION

The present invention relates generally to frequency synthesizers and more specifically to a method and apparatus for generating an output signal in a digital-to-phase converter.

BACKGROUND OF THE INVENTION

A number of devices, for instance mobile applications such as portable devices, require the use of a frequency synthesizer for operation. One such frequency synthesizer includes a digital-to-phase converter (DPC). FIG. 1 illustrates a block diagram of a prior art DPC 100 configuration for generating an output signal 42 at a desired frequency $F_{out}$. DPC 100 comprises a fixed frequency source 10 for generating a clock signal 12 having a frequency of $F_{ref}$. Clock signal 12, thus, comprises a plurality of successive clock pulses having a rising edge and a falling edge and occurring at a frequency $F_{ref}$. Clock signal 12 is further characterized by a plurality of corresponding successive clock cycles that each begins with a rising edge of one of the clock pulses and ends with the rising edge of the next clock pulse.

DPC 100 further comprises: a tapped delay line 20 having M number of adjustable delay elements (not shown); a multiplexer 40 (also referred to herein as a "MUX"); and a digital control device or digital block 30 such as, for instance, an accumulator-based processor. It should be understood by those of ordinary skill in the art that DPC 100 typically includes additional conventional elements that are not shown for the sake of brevity. For instance, delay line 20 is typically a part of a delay-locked loop (DLL) that also typically includes a phase detector, a charge pump and a low pass filter, which make up a stabilization circuit for the DLL.

In operation, delay line 20 receives the clock signal 12 into an input and then generates a set of time delayed (or phase-shifted) clock signals at a plurality of output taps illustrated as Taps[0:M−1]. The time delays are generated by the delay elements in delay line 20, which are connected in cascade and which may be, for instance, inverter gates, transmission line structures, and the like, depending upon a desired DPC implementation. Moreover, an overall time delay between a signal at a first point on the delay line, which is typically an input of a first delay element, e.g., D1, and a signal at a second point on the delay line, which is typically the output of the Mth delay element, e.g., DM, is controlled by a control signal, e.g., a bias voltage, input into delay line 20. This overall delay may be, for instance, a wavelength (i.e., 360 degrees) which is one period of clock signal 12, a half wavelength (i.e., 180 degrees) which is one half period of clock signal 12, or whatever delay is required for a particular application. Ideally, each delay element will replicate the input waveform with a time delay at the delay element output that is equal to the total delay from the input of the first delay element through the output of the last delay element divided by the total number of delay elements (i.e., M).

Typically, delay elements D1-D(M−1) each have a corresponding output tap T[1]-T[M−1], respectively, which is connected to an input of MUX 40. In addition, a tap T[0] is typically connected between the input of the delay element D1 and an input of MUX 40. Each delay element D1-D(M−1) delays the propagation of the clock signal 12 and outputs on its corresponding output tap T[1]-T[M−1], respectively, a corresponding phase-shifted clock signal. Accordingly, the number M−1 of phase-shifted clock signals output by delay elements D1-D(M−1) are supplied via output taps T[1]-T[M−1] to the inputs of MUX 40 along with the clock signal 12 output (i.e., having a zero time delay) on tap T[0].

MUX 40 operates in a conventional way under the control of digital block 30 using a digital control signal 32 to connect, one at a time, a sequence of phase-shifted clock signals to an output of MUX 40 to provide an output signal 42 at the desired output frequency $F_{out}$. Digital block 30 is typically a tap selection controller that comprises digital processing to determine a tap to connect to an output of MUX 40. Digital block 30 then generates and provides to MUX 40 a digital control signal 32 (also referred to herein by the notation dig_ctl[0:M−1]) on one or more digital control lines, which identifies which tap to select (e.g., Taps[0:M−1]). The end result of this implementation is the generation of a multiplicity of clock edges (or pulses) that are delayed in time generally over one period of the input reference clock.

When generating the output signal 42, there is a phase/timing relationship that must be maintained between the clock signal 12 that drives the digital block 30 and the phase-shifted clock signal that propagates down the delay line 20 to an output of MUX 40. This phase/timing relationship is maintained by a proper windowing technique. Windowing is defined herein as opening a path to an output of MUX 40 early enough and closing that path late enough so that all of a desired phase-shifted clock pulse and none of a proceeding or later pulse is seen at the output of the MUX.

Referring again to DPC 100 illustrated in FIG. 1, under certain circumstances a windowing error may occur when MUX 40 uses control signal 32 to open a window of time within which a phase-shifted clock signal pulse is to be sent to an output of MUX 40. For example, let's assume that the delay line 20 is locked to one wavelength of clock signal 12 and that there are 32 output taps. In this embodiment, control signal 32 is synchronized with the leading edge of clock signal 12, and no more than one output pulse 42 is generated for every cycle of clock signal 12. A windowing error will generally not occur when MUX 40 selects output taps from the first half (i.e., taps T[0] through T[15]) of the delay line 20, where the rising and falling edges of the phase-shifted clock signals from taps T[0] through T[15] occur within a single cycle duration of control signal 32. However, a windowing error may occur when MUX 40 selects an output tap from the second half (i.e., taps T[16] through T[31]) of the delay line 20, where the falling edge of the phase-shifted clock signals from taps T[16] through T[31] occur after the falling edge of the control signal 32. Waveforms 200-250 in FIG. 2 illustrate such a windowing error.

Waveform 200 represents clock signal 12. Waveform 240 represents the desired output signal 42, and waveform 250 represents the actual output signal 42. Accordingly, in an attempt to generate the first pulse of the desired output signal 42, the digital block 30 of DPC 100 generates a digital control signal 32 represented by waveform 210 and labeled dig_ctl[0] for use by MUX 40 to generate that first pulse. Under the control of dig_ctl[0], MUX 40 will be directed to select output Tap[0], which in this instance is the output tap corresponding to clock signal 12 (i.e., waveform 200). Moreover, in this embodiment, the width of the pulse and location of the pulse in time determines the time during which the signal from Tap[0] will be sent to an output of MUX 40. As can be seen by waveform 250, under the control of the first control signal 32 (i.e., dig_ctl[0]), MUX 40 captures the desired pulse from Tap[0] (that is circled in waveform 200 with an arrow drawn to the corresponding pulse in waveform 240) thereby causing the actual output pulse to be the desired output pulse.

This is not the case when generating the second pulse of output signal 42. In an attempt to generate the second pulse of the desired output signal 42, the digital block 30 of DPC 100 generates a digital control signal 32 represented by waveform 230 and labeled dig_ctl[24] for use by MUX 40 to generate that second pulse. Under the control of dig_ctl[24], MUX 40 will be directed to select output Tap[24]. However as can be seen from waveform 250, the width and the location in time of the dig_ctl[24] pulse causes MUX 40 to capture only a portion of the desired pulse from Tap[24] (that is circled in waveform 220 with an arrow drawn to the corresponding pulse in waveform 240) and to also capture a portion of the preceding pulse. Thus, the windowing error resulting from the timing of dig_ctl[24] causes a corresponding error in the actual output signal 42 as illustrated in waveform 250.

Known windowing apparatus (not shown) used with DPC 100 comprises a replica of the primary delay line 20 on each digital control line from digital block 30. Accordingly, to perform windowing the control signal for output Tap[1] is delayed using one delay element from its corresponding delay line. The control signal for output Tap[2] is delayed using two delay elements from its corresponding delay line, and likewise for the remaining output taps in the delay line. Thus, the DPC uses output taps from these secondary delay lines to open and close a window of time for the phase-shifted clock signal from each tap selection from the primary delay line 20 to be passed to the MUX output. Where there are M control lines for M output taps, a minimum of M/2 additional delay lines are needed in the DPC causing an M/2 increase in area and power dissipation of the DPC. For multiple independent output terminals of MUX 40 sharing a common tapped delay line requiring separate tap selection networks, such a windowing scheme is completely impractical.

Thus, there exists a need for a method and apparatus for use in a DPC that addresses the above-identified windowing errors and corresponding error in output signals generated by frequency synthesizers known in the art and that does not require the use of secondary delay lines that increase the size of the DPC and its power dissipation.

BRIEF DESCRIPTION OF THE FIGURES

A preferred embodiment of the invention is now described, by way of example only, with reference to the accompanying figures in which:

FIG. 8 illustrates a windowing and selection circuit in accordance with another embodiment of the present invention for use in the DPC illustrated in FIG. 3; and FIG. 9 illustrates a flow diagram of a method for generating a desired output signal using the windowing and selection circuit embodiment illustrated in FIG. 8.

DETAILED DESCRIPTION OF THE INVENTION

Figure 1:
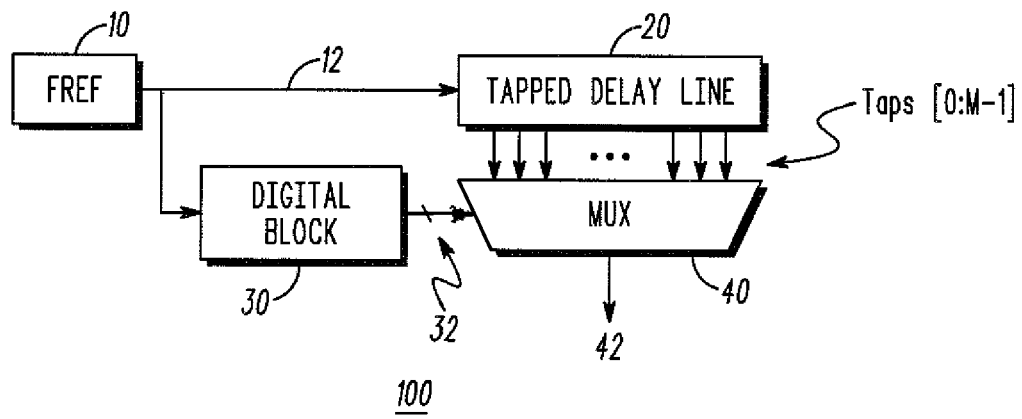
FIG. 1 illustrates a block diagram of a prior art digital-to-phase converter (DPC)
Figure 2:
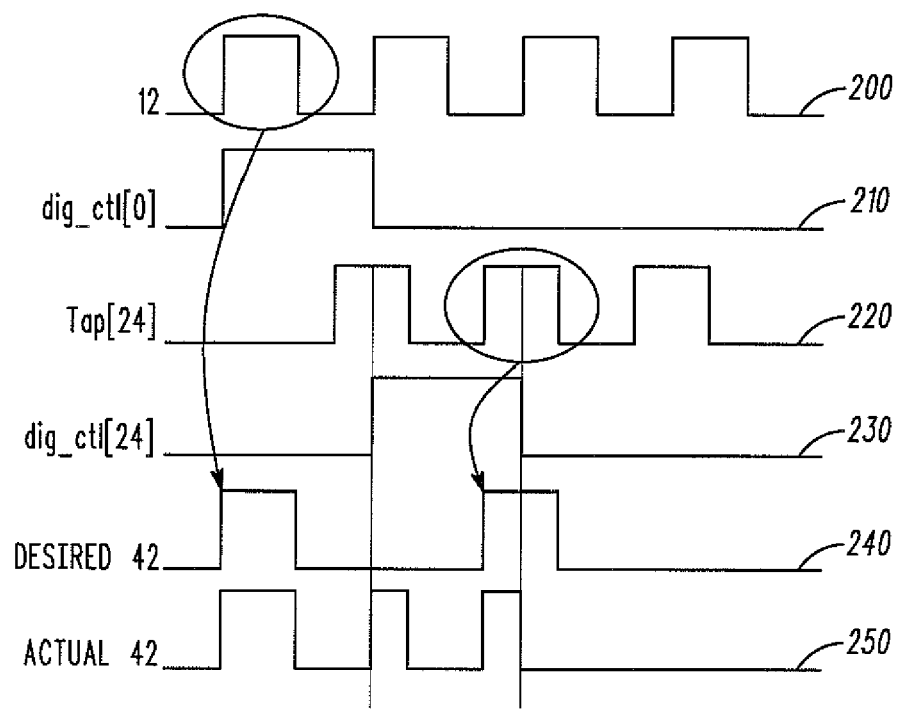
FIG. 2 illustrates a set of waveforms that demonstrate a windowing error and corresponding output error generated in the DPC of FIG. 1.

While this invention is susceptible of embodiments in many different forms, there are shown in the figures and will herein be described in detail specific embodiments, with the understanding that the present disclosure is to be considered as an example of the principles of the invention and not intended to limit the invention to the specific embodiments shown and described. Further, the terms and words used herein are not to be considered limiting, but rather merely descriptive. It will also be appreciated that for simplicity and clarity of illustration, elements shown in the figures have not necessarily been drawn to scale. For example, the dimensions of some of the elements are exaggerated relative to each other. Further, where considered appropriate, reference numerals have been repeated among the figures to indicate corresponding elements.

Figure 3:
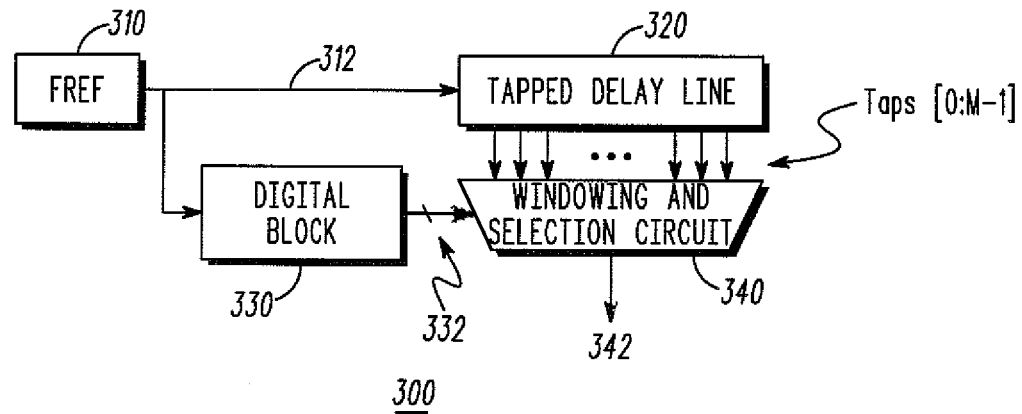
FIG. 3 illustrates a block diagram of a DPC in accordance with an embodiment of the present invention.

FIG. 3 illustrates a block diagram of a DPC 300 in accordance with an embodiment of the present invention for generating an output signal 342 at substantially a desired frequency $F_{out}$, i.e., within a tolerance that corresponds to an acceptable spurious level at the output of DPC 300 depending upon the particular application. DPC 300 comprises a frequency source 310, which is typically a fixed frequency source, for generating a clock signal 312 having a frequency of $F_{ref}$. Clock signal 312, thus, comprises a plurality of successive clock pulses having a rising edge and a falling edge and occurring at a frequency $F_{ref}$. Clock signal 312 is further characterized by a plurality of corresponding successive clock cycles that each begins with a rising edge of one of the clock pulses and ends with the rising edge of the next clock pulse.

DPC 300 further comprises: a conventional tapped delay line 320 having M number of adjustable delay elements (not shown), where M may be for instance 32; a windowing and selection circuit 340 in accordance with embodiments of the present invention; and a digital control device or digital block 330 such as, for instance, a conventional accumulator-based processor. It should be understood by those of ordinary skill in the art that DPC 300 typically includes additional conventional elements that are not shown for the sake of brevity. For instance, delay line 320 is typically a part of a DLL that also typically includes a phase detector, a charge pump and a low pass filter, which make up a stabilization circuit for the DLL.

In operation, delay line 320 receives the clock signal 312 into an input and then generates a set of time delayed (or phase-shifted) clock signals at a plurality of output taps illustrated as Taps[0:M−1]. The time delays are generated by the delay elements in delay line 320, which are connected in cascade and which may be, for instance, inverter gates, transmission line structures, and the like, depending upon a desired DPC implementation. Moreover, an overall time delay between a signal at a first point on the delay line, which is typically an input of a first delay element, e.g., D1, and a signal at a second point on the delay line, which is typically the output of the Mth delay element, e.g., DM, is controlled by a control signal, e.g., a bias voltage, input into delay line 320. This overall delay may be, for instance, a wavelength, a half wavelength, or whatever delay is required for a particular application. Ideally, each delay element will replicate the input waveform, with a time delay, at the delay element output that is equal to the total delay from the input of the first delay element through the output of the last delay element divided by the total number of delay elements (i.e., M).

Delay line 320 also includes a number of output taps so that the corresponding phase-shifted clock signals may be provided to windowing and selection circuit 340 for generating the output signal 342, which generally comprises a plurality of successive output pulses. Typically the number of output taps is equal to the number of delay elements. Moreover in a typical embodiment, delay elements D1-D(M−1) would each have a corresponding output tap T[1]-T[M−1], respectively, and an output tap T[0] would be connected from the input of delay element D1 for providing the clock signal 312 (i.e., with a zero time delay). However, those of ordinary skill in the art will realize that taps T[1] through T[M] may, alternatively, be used as the output taps without departing from the present invention. Each of the output taps are connected to at least one input of the windowing and selection circuit 340, in accordance with embodiments of the present invention. Each delay element D1-D(M−1) delays the propagation of the clock signal 312 and outputs on its corresponding output tap T[1]-T[M−1], respectively, a corresponding phase-shifted clock signal. Accordingly, the number M−1 of phase-shifted clock signals output by delay elements D1-D(M−1) are supplied via output taps T[1]-T[M−1] to at least one input of windowing and selection circuit 340 along with the clock signal 312 output on tap T[0].

Windowing and selection circuit 340 ideally comprises a plurality of sequential logic devices, wherein a sequential logic device is defined herein as a logic device with an output that depends on both the present input(s) to the device and also on past input(s) (i.e., the device's present internal state). These sequential logic devices are coupled in accordance with embodiments of the present invention, for example as described below, and are used to connect, one at a time, a sequence of phase-shifted clock signal pulses to an output of windowing and selection circuit 340 to provide an output signal 342 at substantially the desired output frequency $F_{out}$.

Digital block 330 may be, for example, a conventional accumulator-based tap selection controller. The primary function of digital block 330 is to generate and provide to windowing and selection circuit 340 a digital control signal 332 (also referred to herein by the notation dig_ctl[0:M−1]) that is based on a desired output signal and that includes output tap selection data, i.e. which identifies a given output tap.

Figure 4:
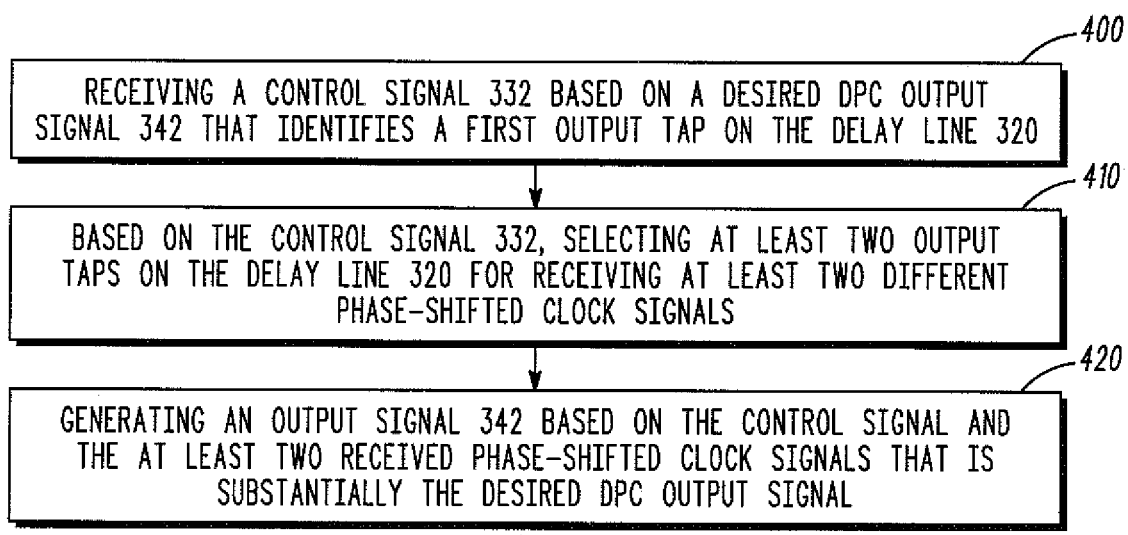
FIG. 4 illustrates a flow diagram of a method for generating a desired output signal in a DPC in accordance with an embodiment of the present invention.

FIG. 4 illustrates a flow diagram of a method for generating a desired output signal in a DPC, for instance DPC 300, in accordance with an embodiment of the present invention. This method would generally be performed in the windowing and selection circuit 340 of DPC 300. An advantage of the present invention is that windowing and generation of the output signal 342 may be performed without the need for secondary delay lines to address windowing errors, as is needed in the prior art.

Turning again to the method of FIG. 4, at step 400, circuit 340 receives a control signal 332 from digital block 330 that is based on a desired DPC output signal 342 (i.e., having a desired output frequency) and that typically identifies one of the output taps on the delay line 320 (i.e., a first output tap) and its corresponding phase-shifted clock signal. At step 410, based upon that control signal, the windowing and selection circuit selects at least two output taps from delay line 320 and uses the control signal and the corresponding phase-shifted clock signal(s) from the at least two selected output taps of the delay line 320 to generate, at step 420, an output signal 342 that is substantially the desired DPC output, i.e., that has substantially the desired output frequency.

Figure 5:
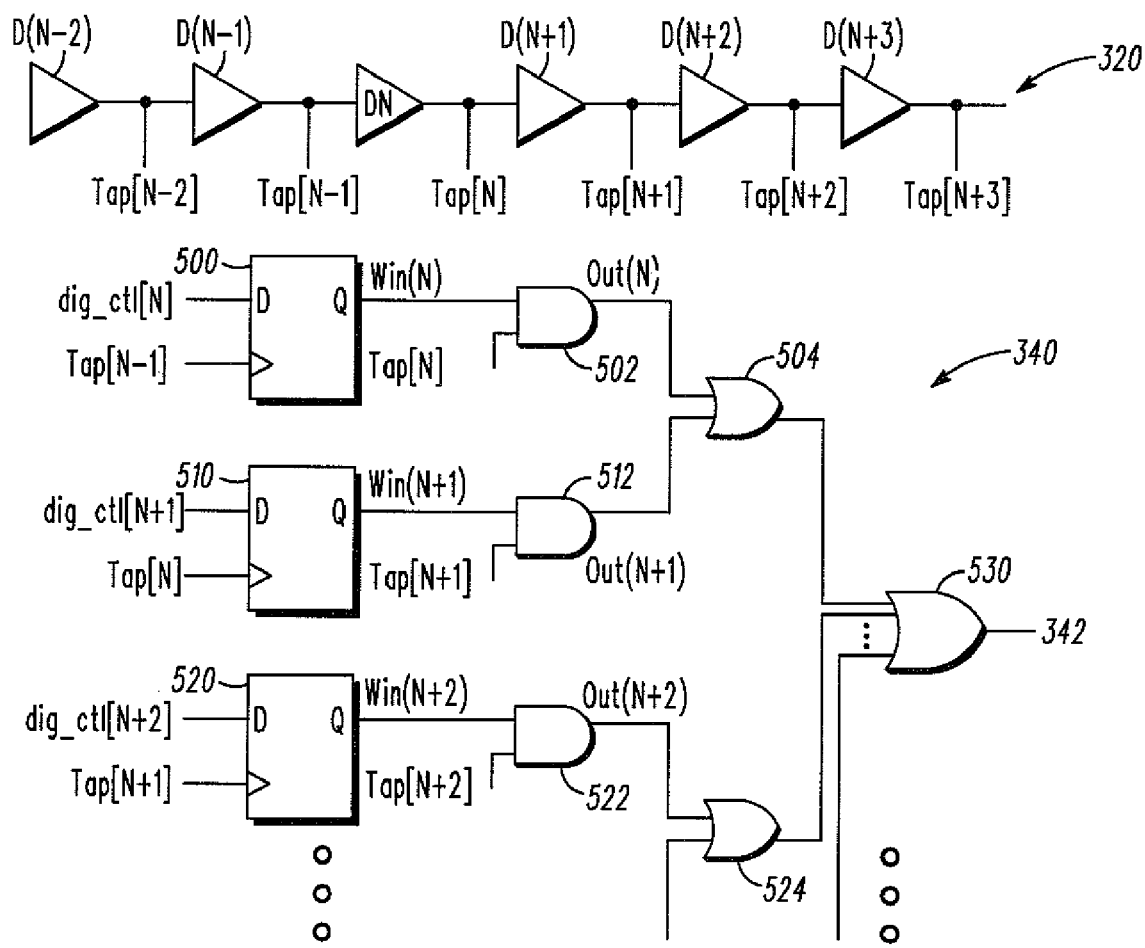
FIG. 5 illustrates a schematic diagram of a delay line and a windowing and selection circuit in accordance with an embodiment of the present invention for use in the DPC illustrated in FIG. 3.

FIG. 5 illustrates a schematic diagram of a delay line 320 and a windowing and selection circuit 340 in accordance with an embodiment of the present invention for use in the DPC illustrated in FIG. 3. Thus, shown in FIG. 5 is an example of an embodiment of windowing and selection circuit 340 that may be used to implement the method illustrated in FIG. 4. The delay line 320 shown in FIG. 5 includes six delay elements (DN, D(N−1), D(N−2), D(N+1), D(N+2) and D(N+3)). Delay line 320 contains only six delay elements for ease of illustration. However, those of ordinary skill in the art will realize that delay line 320 would typically contain additional delay elements. Delay line 320 also includes six corresponding output taps, e.g., T[N], T[N−1], T[N−2], T[N+1], T[N+2] and T[N+3]. Ideally, each of these output taps is coupled to at least one input of windowing and selection circuit 340.

This first embodiment of windowing and selection circuit 340 (illustrated in FIG. 5) comprises a plurality of D flip-flops, e.g., flip-flops 500, 510 and 520. Ideally the number of D flip-flops used is equal to the number of taps on the delay line. A control signal 332 is received into the D input of each flip-flop that is based on a desired output signal pulse and that identifies an output tap on delay line 320. Moreover, each flip-flop receives a control signal that identifies a different output tap and corresponding phase-shifted clock signal from delay line 320 (as shown), and ideally the control signal corresponding to each possible output tap from delay line 320 serves as a D input for a different flip-flop. Furthermore, each D flip-flop is clocked at one of its inputs by a phase-shifted clock signal from an output tap that is different from the output tap identified in the digital control signal received into its D input.

For each D flip-flop in this embodiment, the output tap corresponding to the phase-shifted clock signal used to clock the D flip-flop is offset from the output tap identified in the digital control signal received into its D input, by a predetermined number of output taps. Consider D flip-flop 500 for example. Its D input is dig_ctl[N], which identifies Tap[N]. The phase-shifted clock signal used to clock flip-flop 500 is received from a selected output tap that is offset from Tap[N] by a predetermined integer number of taps. In this case, the phase-shifted clock signal used to clock flip-flop 500 is received from selected output Tap[N−1] that is one tap before Tap[N]. In this embodiment, the Q output signal Win(N) is used as a windowing signal for a pulse being sent to the output of circuit 340 to generate output signal 342 as explained in more detail below. This windowing signal is typically a pulse and is used to maintain the timing relationship between the clock signal (pulse) 312 that drives digital block 330 and the phase-shifted clock signal (pulse) that is received from its corresponding selected output tap on delay line 320 and propagated to an output of windowing and selection circuit 340.

This first embodiment of windowing and selection circuit 340 (illustrated in FIG. 5) further comprises a combining network coupled to the outputs of the flip-flops and to at least a portion of the output taps from the delay line. The combining network ideally includes a plurality of combinational logic devices, i.e., logic gates. Ideally, the combining network includes a plurality of AND gates (e.g., AND gates 502, 512, and 522) coupled in parallel, wherein the Q output of each D flip-flop is coupled to an input of a different AND gate. As a second input into each AND gate, a phase-shifted clock signal is received from an output tap selected from delay line 320 that is offset from the output tap corresponding to the phase-shifted clock signal used to clock the D flip-flop by a predetermined number of output taps. Ideally, but not necessarily, the second input into each AND gate is the phase-shifted clock signal from the output tap identified in the control signal received into the D input of the flip-flop coupled to that AND gate.

Again consider D flip-flop 500 as an example. Its D input is dig_ctl[N], which identifies Tap[N] and its corresponding phase-shifted clock signal. Its Q output (Win(N)) is a windowing signal and is received into a first input of AND gate 502. WIN(N) is combined with the phase-shifted clock signal (in the case from selected Tap[N]) received into a second input of AND gate 502 to generate an output pulse Out(N) at an output of AND gate 502. In this manner, WIN(N) provides for a window of time during which output pulse Out(N) is passed to the output of the windowing and selection circuit 340 to be provided as an output pulse 342.

The pulse combining network of circuit 340 illustrated in FIG. 5 further includes a plurality of OR gates (e.g., OR gates 504, 524 and 530) coupled together for combining the outputs of the AND gates to propagate Out(N) to an output of the windowing and selection circuit (i.e., a DPC output) in order to generate output signal 342 (in this embodiment at the output of OR gate 530). In this embodiment, the outputs of AND gates 502 and 512 are the inputs to OR gate 504, and the output of AND gate 522 is an input to OR gate 524. The output of OR gates 504 and 524 are the inputs of OR gate 530. Those of ordinary skill in the art will realize that the number of AND gates and OR gates and the configuration of these logic devices in circuit 340 will depend on the particular implementation and on the number of flip-flops used in the circuit.

Figure 6:
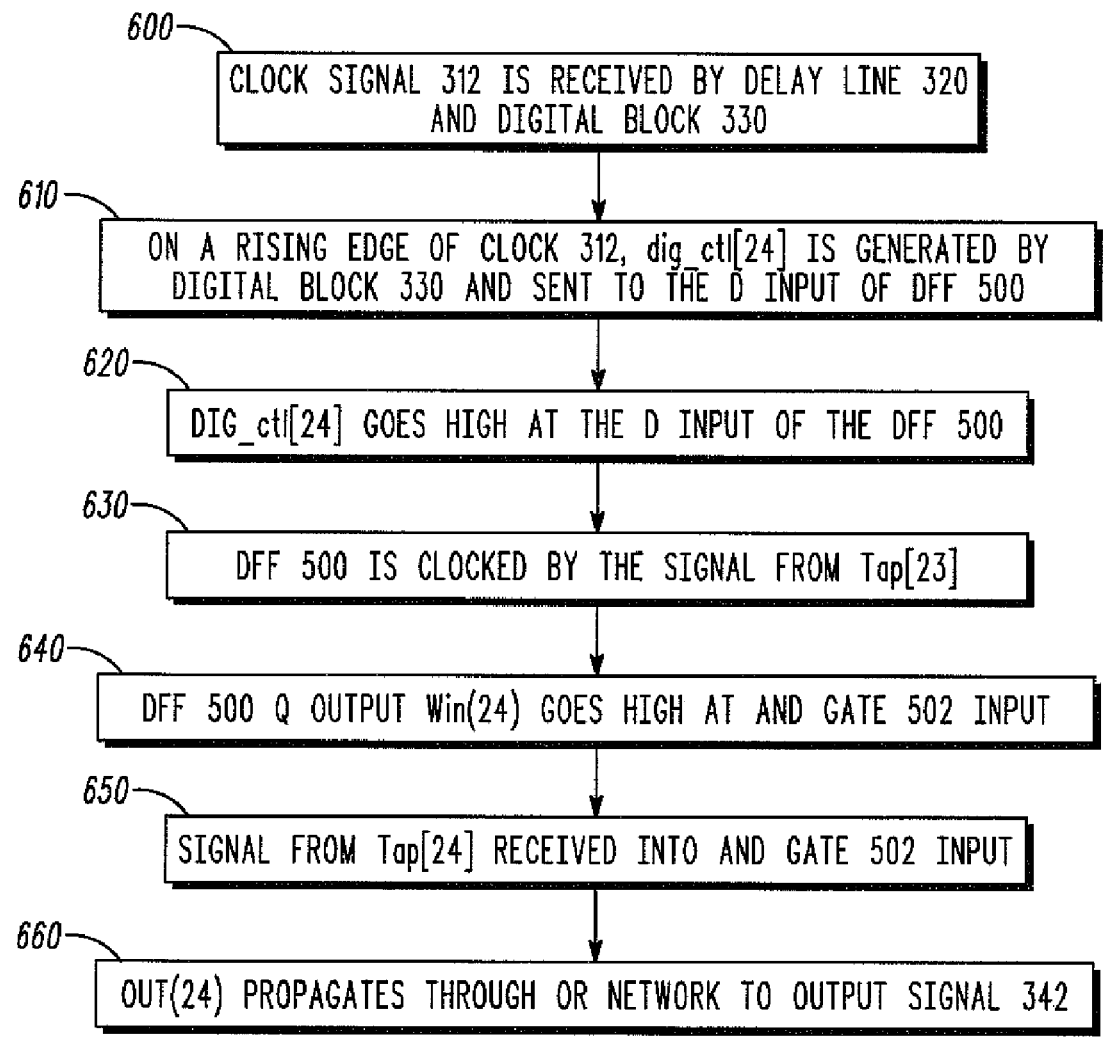
FIG. 6 illustrates a flow diagram of a method for generating a desired output signal using the windowing and selection circuit embodiment illustrated in FIG. 5.
Figure 7:
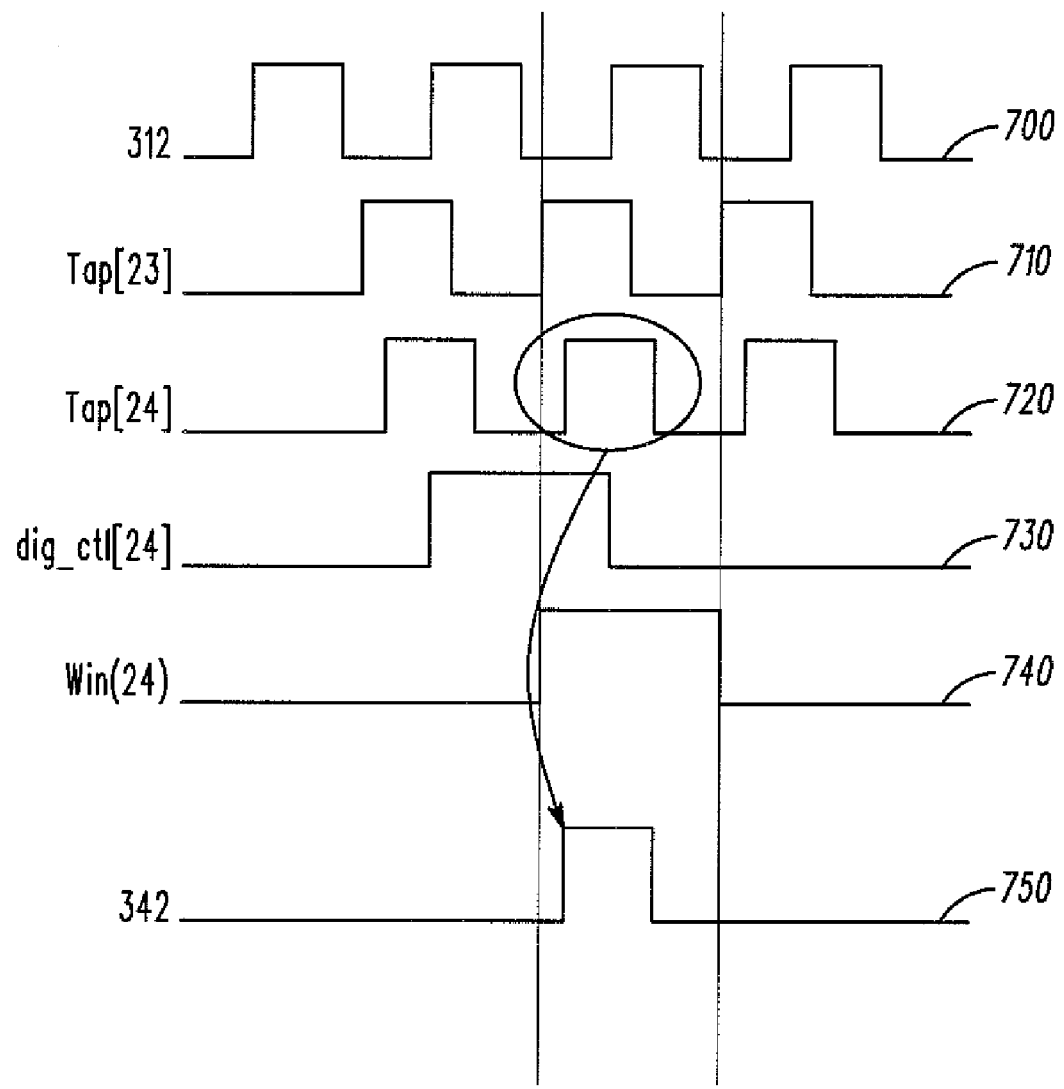
FIG. 7 illustrates a corresponding set of waveforms that demonstrate the synthesis of a desired output pulse using the method of FIG. 6.

FIG. 6 illustrates a flow diagram of a method for generating a desired output signal using the windowing and selection circuit embodiment illustrated in FIG. 5. More specifically, the flow diagram of FIG. 6 illustrates an output signal pulse 342 being generated at the output of OR gate 530 based upon a digital control signal 332 being received into D flip-flop 500. FIG. 7, which will be concurrently discussed with FIG. 6, illustrates a corresponding set of waveforms that demonstrate the synthesis of a desired output pulse 342 using the method of FIG. 6. In the illustration shown in FIGS. 6 and 7, N=24 and the desired output pulse 342 is the pulse circled in waveform 720 of FIG. 7.

Accordingly, at step 600, clock signal 312 (waveform 700) is received by delay line 320 and digital block 330. At step 610, on a rising edge of clock pulse 312 (in this case the second clock pulse shown of waveform 700), dig_ctl[24] (pulse 730) is generated by the digital block 330 based upon a desired output signal pulse and sent to the D input of D flip-flop (DFF) 500. At step 620, dig_ctl[24] goes high at the D input of DFF 500. At step 630, DFF 500 is clocked by the rising edge of the phase-shifted clock signal pulse from selected output Tap[23] (i.e., during the second pulse of waveform 710). At step 640, since dig_ctl[24] is high when DFF 500 is clocked then the Q output of DFF 500, i.e., Win(24) (waveform 740), follows the D input and also goes high at one of the inputs of AND gate 502. Win(24) remains high until the DFF 500 is again clocked by waveform 710 (with the third pulse) because at this point in time the D input (i.e., dig_ctl[24]) is low. At step 650, the phase-shifted clock signal from Tap[24] is received into the other input of AND gate 502 resulting in the phase-shifted clock signal from Tap[24] being seen as the output (i.e., Out(24)) of AND gate 502. At step 660, Out(24) propagates through OR gates 504 and 530 as is seen at the DPC output as output signal pulse 342 (waveform 750), wherein the actual output pulse 342 is substantially the desired output pulse.

FIG. 8 illustrates a windowing and selection circuit 340 in accordance with another embodiment of the present invention for use in the DPC illustrated in FIG. 3. This embodiment of windowing and selection circuit 340 comprises a plurality of RS flip-flops, e.g., flip-flops 810, 820 and 830. Ideally the number of RS flip-flops used is equal to the number of taps on the DPC delay line, e.g., delay line 320. A control signal 332 is received into the enable input (shown as the "en" input in FIG. 8 and also referred to herein as the clock input) for each flip-flop that is based on a desired output signal pulse and that identifies an output tap on delay line 320. Moreover, each flip-flop receives a control signal that identifies a different output tap and corresponding phase-shifted clock signal from delay line 320 (as shown), and ideally the control signal corresponding to each possible output tap from delay line 320 serves as a clock input for a different flip-flop. Furthermore, each RS flip-flop ideally receives as its R input and its S input two different phase-shifted clock signals from corresponding output taps that are both different from the output tap identified in the digital control signal received into its clock input.

For each RS flip-flop in this embodiment, the output tap corresponding to the phase-shifted clock signal received into its R input, and the output tap corresponding to the phase-shifted clock signal received into its S input are each offset from the output tap identified in the digital control signal received into its clock input by a predetermined number of output taps, which may be the same or a different predetermined number of output taps depending upon the implementation. Consider RS flip-flop 810 for example. Its clock input is dig_ctl[N], which identifies Tap[N]. The phase-shifted clock signal received into its R input is received from a selected output tap that is offset from Tap[N] by a predetermined integer number of taps, and the phase-shifted clock signal received into it S input is received from a different selected output tap that is offset from Tap[N] by a different predetermined number of taps. In this case, the phase-shifted clock signal received into the R input of flip-flop 810 is received from selected output Tap[N+Y], and the phase-shifted clock signal received into its S input is received from selected output Tap[N−X]. In this embodiment, the Q output signal Win(N) is used as a windowing signal for a pulse being sent to the output of circuit 340 to generate output signal 342 as explained in more detail below. The width of pulse Win(N) is determined by the values of X and Y.

This embodiment of windowing and selection circuit 340 (illustrated in FIG. 8) further comprises a combining network coupled to the outputs of the flip-flops and to at least a portion of the output taps from the delay line. The combining network ideally includes a plurality of combinational logic devices, i.e., logic gates. Ideally, the combining network includes a plurality of AND gates (e.g., AND gates 812, 822 and 832) coupled in parallel, wherein the Q output of each RS flip-flop is coupled to an input of a different AND gate. As a second input into each AND gate, a phase-shifted clock signal is received from an output tap selected from delay line 320 that is offset from the output tap corresponding to the phase-shifted clock signal received into the R and S inputs of the RS flip-flop by a predetermined number of output taps. Ideally, but not necessarily, the second input into each AND gate is the phase-shifted clock signal from the output tap identified in the control signal received into the clock input of the flip-flop coupled to that AND gate.

Again consider RS flip-flop 810 as an example. Its clock input is dig_ctl[N], which identifies Tap[N] and its corresponding phase-shifted clock signal. Its Q output (Win(N)) is a windowing signal and is received into a first input of AND gate 812. WIN(N) is combined with the phase-shifted clock signal (in this case from selected Tap[N]) received into a second input of AND gate 812 to generate an output pulse Out(N) at an output of AND gate 812. In this manner, WIN(N) provides for a window of time during which output pulse Out(N) is passed to the output of the windowing and selection circuit 340, to be provided as an output pulse 342.

The pulse combining network of circuit 340 illustrated in FIG. 8 further includes a plurality of OR gates (e.g., OR gates 814, 834 and 840) coupled together for combining the outputs of the AND gates to propagate Out(N) to an output of the windowing and selection circuit (i.e., a DPC output) in order to generate output signal 342 (in this embodiment at the output of OR gate 840). In this embodiment, the outputs of AND gates 812 and 822 are the inputs to OR gate 814, and the output of AND gate 832 is an input to OR gate 834. The output of OR gates 814 and 834 are the inputs of OR gate 840. Those of ordinary skill in the art will realize that the number of AND gates and OR gates and the configuration of these logic devices in circuit 340 will depend on the particular implementation and on the number of flip-flops used in the circuit.

FIG. 9 illustrates a flow diagram of a method for generating a desired output signal using the windowing and selection circuit embodiment illustrated in FIG. 8. More specifically, the flow diagram of FIG. 8 illustrates an output signal pulse 342 being generated at the output of OR gate 840 based upon a digital control signal 332 being received into RS flip-flop (RSFF) 810. Accordingly, at step 900, clock signal 312 is received into delay line 320 and digital block 330. At step 910, on a rising edge of clock signal 312, dig_ctl[N] is generated by digital block 330 and sent to the clock (or enable (en)) input of RSFF 810. At step 920, dig_ctl[N] goes high at the clock input of RSFF 810. At step 930, the phase-shifted clock signal from Tap[N−X] goes high at the S input of RSFF 810. At step 940, the output of RSFF 810 (i.e., Win(N)) goes high and the output combining network propagates the phase-shifted clock signal pulse from Tap[N] (i.e., Out(N)) to the DPC output as output signal pulse 342. At step 950, the phase-shifted clock signal from Tap[N+Y] goes high at the R input of RSFF 810. At step 960, the output of RSFF 810 (i.e., Win(N)) goes low and the output combining network propagates the phase-shifted clock signal pulse from Tap[N] (i.e., Out(N)) to the DPC output as output signal pulse 342.

The embodiment of windowing and selection circuit 340 illustrated in FIG. 5 demonstrates one embodiment of a windowing process that uses the signal path of the primary delay line (e.g., delay line 320) to open and close a window of time for generating an output signal pulse 342. More specifically, this embodiment of circuit 340 opens the window with an output tap from delay line 320 during one clock cycle and then closes the window with the same tap on the next clock cycle. Accordingly, the width of the windowing signal generated is constant and allows only one pulse to be selected from delay line 320 during any one reference clock cycle, to propagate to the DPC output as output signal 342.

However, in the embodiment of windowing and selection circuit 340 illustrated in FIG. 8, the width of the windowing signal generated is the difference in delay between the phase-shifted clock signals from Tap[N−X] and Tap[N+Y]. This width may be adjusted (by adjusting the values of X and Y) to achieve a desired system performance such as, for instance, allowing multiple taps to be selected during any one reference clock cycle, to propagate to the DPC output as output signal 342. Accordingly, the values of X and Y may be programmable values.

While the invention has been described in conjunction with specific embodiments thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. Thus, it should be understood that the invention is not limited by the foregoing description, but embraces all such alterations, modifications and variations in accordance with the spirit and scope of the appended claims.

What is claimed is:

1. A method for generating an output signal in a digital-to-phase converter (DPC), the DPC including a frequency source for generating a clock signal and a delay line configured to receive the clock signal and to generate a plurality of phase-shifted clock signals at a plurality of corresponding output taps on the delay line, the method comprising the steps of:

receiving a control signal that identifies a first output tap on the delay line;

based on the control signal, selecting at least two output taps on the delay line for receiving at least two different phase-shifted clock signals, wherein the at least two selected output taps comprise the first output tap and a second output tap that is offset from the first output tap by a predetermined number of output taps, and wherein a first phase-shifted clock signal is received from the first output tap and a second phase-shifted clock signal is received from the second output tap; and generating an output signal using the control signal and the at least two received phase-shifted clock signals that is substantially a desired output signal, wherein generating the output signal further comprises:

generating a windowing signal based on the control signal and the second phase-shifted clock signal; and combining the windowing signal with the first phase-shifted clock signal to generate the output signal.

2. The method of claim 1, wherein the second output tap is offset from the first output tap by one output tap.

3. The method of claim 1 further comprising the steps of:

receiving the control signal into a first input of a sequential logic device;

receiving the second phase-shifted clock signal into a second input of the sequential logic device;

generating the windowing signal at an output of the sequential logic device; and combining the windowing signal and the first phase-shifted clock signal in at least one combinational logic device to generate the output signal.

4. The method of claim 1, wherein:

the clock signal comprises a plurality of successive clock pulses and is characterized by a plurality of corresponding successive clock cycles; and the output signal comprises a plurality of successive output pulses, wherein at least two output pulses are generated during at least one of the clock cycles.

5. The method of claim 1, wherein the at least two selected output taps further comprise a third output tap that is offset from the first output tap by a predetermined number of output taps.

6. The method of claim 5, wherein the second output tap is offset from the first output tap by a first predetermined number of output taps and the third output tap is offset from the first output tap by a second predetermined number of output taps.

7. The method of claim 5, wherein a third phase-shifted clock signal is received from the third output tap, the method further comprising the steps of:

generating a windowing signal based on the control signal and the second and third phase-shifted clock signals; and combining the windowing signal with the first phase-shifted clock signal to generate the output signal.

8. The method of claim 7 further comprising the steps of:
receiving the control signal into a first input of a sequential logic device;
receiving the second phase-shifted clock signal into a second input of the sequential logic device;
receiving the third phase-shifted clock signal into a third input of the sequential logic device;
generating the windowing signal at an output of the sequential logic device; and
combining the windowing signal and the first phase-shifted clock signal in at least one combinational logic device to generate the output signal.

9. A digital-to-phase converter (DPC) comprising:
a frequency source for generating a clock signal;
a delay line configured to receive the clock signal and to generate a plurality of phase-shifted clock signals at a plurality of corresponding output taps on the delay line;
a digital control device coupled to the frequency source for generating a control signal; and
a windowing and selection circuit comprising:
a plurality of sequential logic devices each having at least one input coupled to the digital control device to receive the control signal, at least one other input coupled to one of the output taps on the delay line, and at least one output generating a corresponding windowing signal; and
a combining network coupled to the outputs of the plurality of sequential logic devices and to at least a portion of the plurality of output taps for generating an output signal by combining the windowing signal from at least a portion of the sequential logic devices with a corresponding phase-shifted clock signal received into the combining network.

10. The DPC of claim 9, wherein each sequential logic device in the plurality is a flip-flop.

11. The DPC of claim 10, wherein each sequential logic device in the plurality is a D flip-flop.

12. The DPC of claim 10, wherein each sequential logic device in the plurality is an RS flip-flop.

13. The DPC of claim 9, wherein the combining network comprises a plurality of combinational logic devices each having at least one input coupled to one of the sequential logic device outputs, at least one other input coupled to one of the output taps on the delay line and at least one output coupled to the output of at least one other combinational logic device.

14. The DPC of claim 13, wherein the plurality of combinational logic devices includes:

a plurality of AND gates, each having at least one input coupled to one of the sequential logic device outputs, at least one other input coupled to one of the output taps on the delay line, and at least one output; and
a plurality of OR gates coupling together the outputs of each of the AND gates.

15. The DPC of claim 9, wherein the number of sequential logic devices is the same as the number of output taps on the delay line, and each sequential logic device is coupled to a different output tap.

16. A digital-to-phase converter (DPC) comprising:
a frequency source for generating a clock signal;
a delay line configured to receive the clock signal and to generate a plurality of phase-shifted clock signals at a plurality of corresponding output taps on the delay line;
a digital control device coupled to the frequency source for generating a control signal based on a desired output signal; and
a windowing and selection circuit for generating an output signal, the windowing and selection circuit comprising:
a plurality of D flip-flops each having a first input coupled to the digital control device to receive the control signal, a second input coupled to one of the output taps on the delay line and an output;
a combining network comprising: a plurality of AND gates, each having a first input coupled to one of the D flip-flop outputs, a second input coupled to one of the output taps on the delay line, and an output; and a plurality of OR gates coupling together the outputs of each of the AND gates.

17. A digital-to-phase converter (DPC) comprising:
a frequency source for generating a clock signal;
a delay line configured to receive the clock signal and to generate a plurality of phase-shifted clock signals at a plurality of corresponding output taps on the delay line;
a digital control device coupled to the frequency source for generating a control signal based on a desired output signal; and
a windowing and selection circuit for generating an output signal, the windowing and selection circuit comprising:
a plurality of RS flip-flops each having a first input coupled to the digital control device to receive the control signal, a second input coupled to one of the output taps on the delay line, a third input coupled to one other output tap on the delay line and an output; and
a combining network comprising: a plurality of AND gates, each having a first input coupled to one of the RS flip-flop outputs, a second input coupled to one of the output taps on the delay line, and an output; and a plurality of OR gates coupling together the outputs of each of the AND gates.

* * * * *